United States Patent
Goel et al.

(10) Patent No.: US 8,258,877 B2
(45) Date of Patent: Sep. 4, 2012

(54) FEED-BACK AND FEED-FORWARD SYSTEMS AND METHODS TO REDUCE OSCILLATOR PHASE-NOISE

(75) Inventors: Ankush Goel, Los Angeles, CA (US); Alireza Imani, Irvine, CA (US); Hossein Hashemi, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 31 days.

(21) Appl. No.: 12/727,194

(22) Filed: Mar. 18, 2010

(65) Prior Publication Data
US 2010/0237958 A1 Sep. 23, 2010

Related U.S. Application Data

(60) Provisional application No. 61/161,354, filed on Mar. 18, 2009.

(51) Int. Cl.
*H03L 7/00* (2006.01)
*H03B 28/00* (2006.01)
*H03C 3/02* (2006.01)

(52) U.S. Cl. .......... 331/1 R; 331/74; 331/175; 332/144; 327/154

(58) Field of Classification Search .......... 331/1 R, 331/9, 18, 74, 175; 332/144, 146, 123; 375/296, 375/371; 455/63.1, 67.16, 303, 304, 305, 455/306, 310; 329/336, 337, 345, 315, 327
See application file for complete search history.

(56) References Cited

U.S. PATENT DOCUMENTS

| | | | |
|---|---|---|---|
| 4,847,477 A | 7/1989 | Smith | |
| 5,559,476 A * | 9/1996 | Zhang et al. | 331/57 |
| 5,661,439 A | 8/1997 | Watkins et al. | |
| 7,098,748 B2 * | 8/2006 | Schmidt | 331/176 |
| 2007/0206961 A1 | 9/2007 | Iannelli | |
| 2008/0007345 A1 * | 1/2008 | Cranford et al. | 331/16 |
| 2008/0129352 A1 * | 6/2008 | Zhang | 327/157 |

OTHER PUBLICATIONS

Bianchini, M.J. et al. 1984. A Single-resonator GAAS FET Oscillator with Noise Degeneration. IEEE MTT-S Digest, 1984, pp. 270-273.
Dick, G. J. et al. 1990. Ultra-low Noise Microwave Phase Stabilizer Using Sapphire Ring Resonator. 44th Annual Symposium on Frequency Control 1990, IEEE, pp. 577-584.

(Continued)

*Primary Examiner* — Ryan Johnson
(74) *Attorney, Agent, or Firm* — McDermott Will & Emery LLP

(57) ABSTRACT

Systems, methods, and apparatus are described that provide for low phase-noise, spectrally-pure, and low-jitter signals from electrical oscillators. An aspect of the present disclosure includes utilization of an open-loop feed-forward phase-noise cancellation scheme to cancel phase noise, or jitter, of an electrical oscillator. Phase noise can be measured and then subtracted, with the phase noise measurement and subtraction being performed at a speed faster than phase noise variations of the oscillator. Another aspect of the present disclosure includes use of a feedback scheme for phase noise reduction. A feedback scheme can be used alone or in conjunction with a feed-forward scheme. Related phase-noise cancellation and/or reduction methods are described. Notch filter and RF amplifier circuits are also described.

26 Claims, 8 Drawing Sheets

OTHER PUBLICATIONS

Dick, G. J. et al. 1990. Measurement and Analysis of a Microwave Oscillator Stabilized by a Sapphire Dielectric Ring Resonator for Ultra-Low Noise, IEEE Transactions on Ultrasonics, Ferroelectrics, and Frequency Control, vol. 37, No. 5, Sep. 1990, pp. 339-346.

Drever, R.W.P. et al. 1983. Laser Phase and Frequency Stabilization Using an Optical Resonator. Applied Physics B: Photo-physics and Laser Chemistry, 1983, vol. 31, pp. 97-105.

Galani, Z. et al, 1984. Analysis and Design of a Single-Resonator GAAS FET Oscillator With Noise Degeneration. IEEE Transactions on Microwave Theory and Techniques, vol. MTT-32, No. 12, Dec. 1984, pp. 1556-1565.

Ivanov, E. N. et al. 1995. Advanced Phase Noise Suppression Technique for Next Generation of Ultra Low-Noise Microwave Oscillators. 1995 IEEE International Frequency Control Symposium, pp. 314-320.

Ivanov, E. N. et al. 1998. Applications of Interferometric Signal Processing to Phase-Noise Reduction in Microwave Oscillators. IEEE Transactions on Microwave Theory and Techniques, vol. 46, No. 10, Oct. 1998, pp. 1537-1545.

Ivanov, E. N. et al. 1998. Microwave Interferometry: Application to Precision Measurements and Noise Reduction Techniques. IEEE Transactions on Ultrasonics, Ferroelectrics, and Frequency Control, vol. 45, No. 6, Nov. 1998, pp. 1526-1536.

Ivanov, E. N. et al. 2006. Low Phase-Noise Microwave Oscillators With Interferometric Signal Processing. IEEE Transactions on Microwave Theory and Techniques, vol. 54, No. 8, Aug. 2006, pp. 3284-3294.

Mann, A. G. 1985. Active Stabilization of Crystal Oscillator FM Noise at UHF Using A Dielectric Resonator. IEEE Transactions on Microwave Theory and Techniques, vol. MTT-33, No. 1, Jan. 1985, pp. 51-53.

Santiago, D. G. et al. 1992. Microwave Frequency Discriminator With a Cooled Sapphire Resonator for Ultra-Low Phase Noise, IEEE Frequency Control Symposium 1992, pp. 176-182.

Sen Gupta, A. et al. 2004. High Spectral Purity Microwave Oscillator: Design Using Conventional Air-Dielectric Cavity. IEEE Transactions on Ultrasonics, Ferroelectrics, and Frequency Control, vol. 51, No. 10, Oct. 2004, pp. 1225-1231.

Walls, F.L. et al. 1990. "High Spectral Purity X-Band Source", 44th Annual Symposium on Frequency Control 1990, IEEE, pp. 542-548.

* cited by examiner

FEED-BACK AND FEED-FORWARD SYSTEMS AND METHODS TO REDUCE OSCILLATOR PHASE-NOISE

CROSS-REFERENCE TO RELATED APPLICATIONS

This application is based upon and claims priority to the following: U.S. Provisional Patent Application No. 61/161,354 entitled "METHOD TO REALIZE LOW-PHASE-NOISE, SPECTRALLY PURE, AND LOW-JITTER ELECTRICAL OSCILLATORS AND LASERS," filed Mar. 18, 2009, the entire content of which is incorporated herein by reference.

BACKGROUND

1. Technical Field

This disclosure relates to noise reduction in electrical oscillators.

2. Description of Related Art

Over the past few decades, integrated electronic systems have witnessed an exponential increase in performance and reduction in cost. The majority of electronic systems rely on an accurate frequency source (sometime referred to as a reference clock). The advancements of wireless and wired communications would not be possible without accurate frequency synthesizers that are at the core of synchronous and coherent transceivers. The performance of these systems is directly related to the quality and accuracy of the frequency synthesis. For instance, the bit-error-rate (BER) of a communication scheme reduces as the spectral purity (or phase noise) of the frequency synthesizer that is used for coherent detection of the incoming signal is improved. Reference clocks are also central to all synchronous processors (e.g., virtually all of today's personal computers) and networking schemes.

In the fields of electronics, radio Frequency (RF) systems, and optics there has always been a quest for achieving the purest signal (i.e., lowest-jitter clock, lowest phase noise RF source, and smallest line-width laser, respectively) in a small form-factor and without using excessive power. Phase-noise, timing-jitter, and spectral line-width all represent the same physical phenomena. Ideally, an oscillator generates a pure periodic waveform. The most common signal is a pure sinusoid. In frequency domain, a pure sinusoid is represented by a pair of delta functions, having value only at the oscillation frequency (and its negative value) and zero elsewhere. In real-world implementations though, all practical oscillators have been shown to be noisy. While amplitude noise is usually not a concern, the phase noise can be.

In time domain, oscillator noise is typically referred to as timing jitter. Jitter represents the deviation in oscillator period from the nominal value due to noise. For instance, in a 1 GHz oscillator with 10 ps cycle-to-cycle rms jitter, the oscillation period at every cycle changes by 1% on the average. Timing jitter is more suitable for clock characterization in synchronous communication, processing, and networking schemes. For instance, as the computing or communication speed increase, the jitter should be lower for subsystems to maintain synchronization.

In frequency domain, oscillator noise is typically referred to as phase noise (or spectral line-width). The frequency spectrum of a noisy oscillator will not be a single delta function at the oscillation frequency; rather it will spread to neighboring frequencies as well. Phase noise measures this noise-induced frequency spreading. Phase noise is the relative signal power at an offset frequency (due to spreading) to the oscillator power. For instance, in a 1 GHz oscillator with −120 dBc/Hz at 1 MHz offset frequency, the power of spread signal at 1 GHz±1 MHz in 1 Hz bandwidth is −120 dB lower compared with the total oscillator power.

Physics and mathematics show that these requirements are countervailing. Most oscillators and lasers include a resonator and an active (gain) block. For low phase noise, the Quality Factor (Q) of the resonator must be high. Quality Factor is a measure of stored energy in the resonator relative to its loss. Historically, the majority of oscillator (and laser) research has focused on achieving the highest possible resonator Q.

In the context of electrical oscillators, unfortunately, extremely high-Q (Q>100) resonators at GHz range are not compatible with standard silicon processing technologies. This is due to the loss of typical materials that are used in a standard silicon process and also the small available volume to store energy in an Integrated Circuit (IC). Therefore, in order to realize low-phase-noise RF oscillators and low-jitter high-speed clocks, a common practice is to use a Phase-Locked Loop (PLL) where the frequency and phase of a GHz integrated oscillator are locked (synchronized) with those of a low-frequency low-phase-noise reference. The low frequency reference is often a crystal-based (e.g., quartz) or a Surface Acoustic Wave (SAW)-based oscillator which is among the very few components that is not integrated with the rest of electronics on the same silicon chip. There is a big advantage in terms of cost and footprint to generate low-phase-noise signals without relying on an off-chip crystal reference.

The predominant method to generate a reference clock is to rely on mechanical resonators such as Quartz crystal or Surface Acoustic Wave (SAW)-based resonator clocks. The frequency of these clocks is typically in the MHz range (below GHz).

Frequency multipliers can be used to generate higher frequencies at GHz. The downside of such a scheme is that the generated frequency cannot be tuned. Although fixed-frequency references may be sufficient in some wire-line synchronous communication, processing, and networking schemes, tunable sources are needed in RF transceivers.

Ultra low-phase-noise microwave oscillators are composed of a very high-Q microwave resonator connected in positive feedback to a low-noise gain element. Low-loss optical fibers have been used to implement high-Q delay-line resonators in an electro-optical feedback configuration to realize low phase-noise microwave oscillators. However, in such systems, the quality factor of the actives used in gain element dominates the overall quality factor. Hence, improvement in phase noise beyond certain limit is not possible.

In a more common scheme, Phase locked loops (PLL) are used to lock the frequency and phase of a poor GHz oscillator (integrated on the chip) with those of a high-quality low-frequency clock (such as a Quartz). PLL also allows frequency programmability in the context of Frequency Synthesizers. Typically, the frequency tuning resolution of a PLL-based frequency synthesizer is limited (e.g., a few KHz). Also, as common with all feedback systems the frequency switching time in PLL-based systems is slow.

Direct Digital Synthesizers (DDS) store the exact sinusoid waveform in a memory and read it using an accurate clock. Depending on the speed at which different memory cells are read. Different frequencies can be generated with a very high accuracy (e.g., 0.01 Hz) and with fast speed (rapid frequency hopping when needed). The power consumption of DDS solutions are very high (several Watts in the GHz range), which makes them unusable for most consumer products (e.g., portable devices). They are commonly used in laboratory instrumentation and in some military systems.

SUMMARY

Aspects of the present disclosure address limitations noted previously and are directed to techniques, including systems, methods, and apparatus, providing for low phase-noise, spectrally-pure, and low-jitter signals from electrical oscillators.

An aspect of the present disclosure includes utilization of an open-loop feed-forward phase-noise cancellation scheme to cancel phase noise, or jitter, of an electrical oscillator. Phase noise can be measured and then subtracted, with the phase noise measurement and subtraction being performed at a speed faster than phase noise variations of the oscillator.

Another aspect of the present disclosure includes use of a feedback scheme for phase noise reduction. A feedback scheme can be used alone or in conjunction with a feed-forward scheme.

These, as well as other components, steps, features, benefits, and advantages, will now become clear from a review of the following detailed description of illustrative embodiments, the accompanying drawings, and the claims.

BRIEF DESCRIPTION OF DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
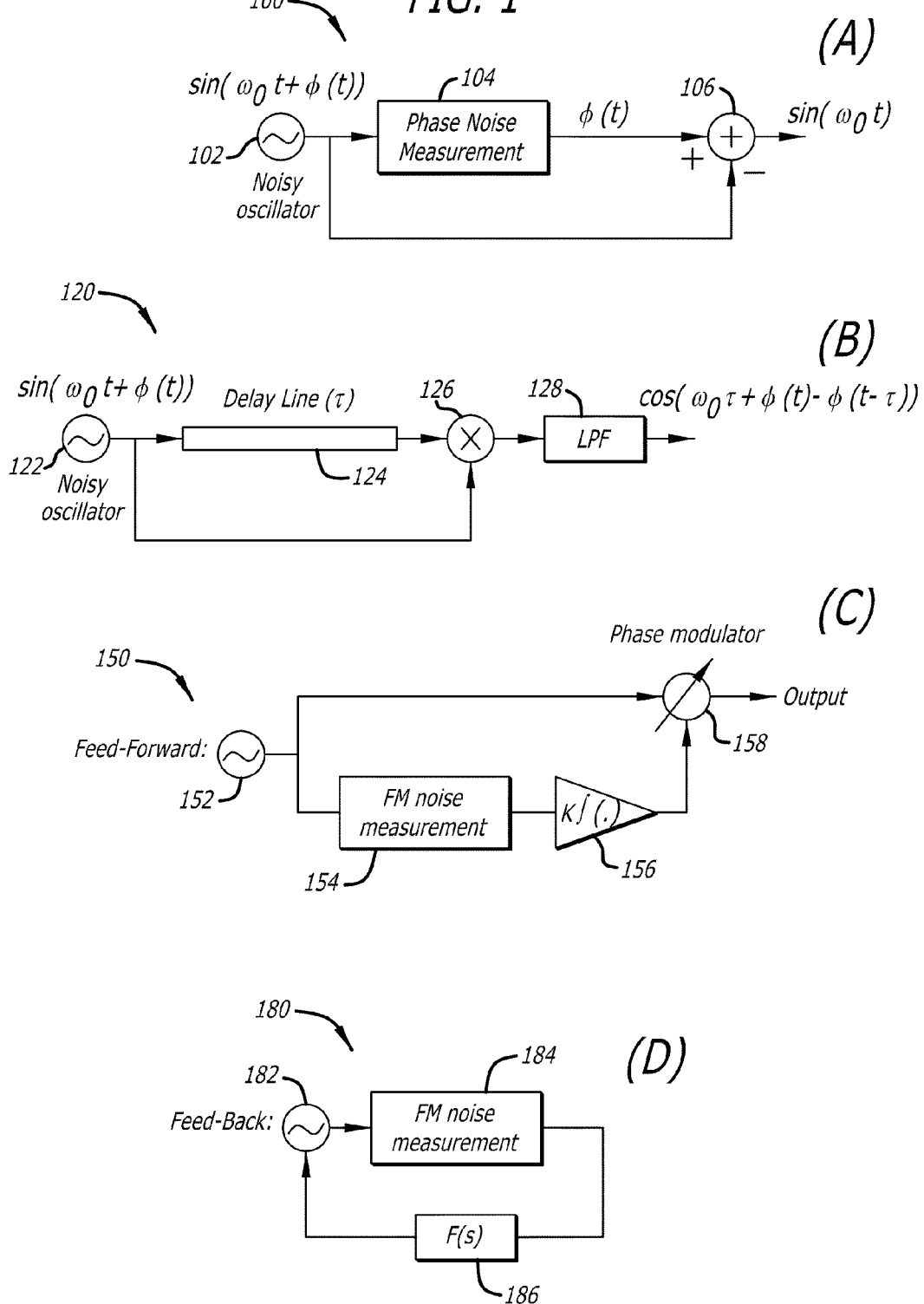
FIG. 1 includes views (A-D), which illustrate simplified schematics of feed-forward and feedback phase-noise cancellation circuits, in accordance with exemplary embodiments of the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Aspects of the present disclosure are directed to phase noise cancellation for electrical oscillators. An aspect of the present disclosure includes feed-forward phase noise cancellation/reduction based on relatively fast phase-noise measurement. Another aspect of the present disclosure includes utilization of feedback to the oscillator itself for phase-noise cancellation/reduction.

FIG. 1A depicts a simplified schematic of a circuit illustrating the basic principle behind a feed-forward phase noise cancellation scheme, according to exemplary embodiments of the present disclosure. The circuit 100 includes oscillator 102, a phase noise measurement block 104, and a summer (or mixer) 106. The output signal of the oscillator 102 is shown as a sinusoid plus a time-varying phase, and is provided to the both the phase noise measurement block 104 and the summer 106.

The oscillator phase noise is first measured using the phase noise measurement block 104, and then it is subtracted from the oscillator phase to produce an output with negligible (ideally, zero) phase noise. Preferably, the phase noise measurement and phase subtraction functions are faster compared with oscillator phase noise variations. In other words, the scheme can cancel the slowly varying (low offset) phase noise. The accuracy of the phase noise cancellation can depend in-part on the sensitivity of the phase noise measurement.

Phase noise can also be measured by comparing the phase of the noisy oscillator with a clean reference. Another method is to measure the spectrum of the noisy oscillator. In general, this method requires a tunable clean reference or a high-speed high-resolution analog to digital conversion.

For exemplary embodiments, it may be desirable to measure the oscillator phase noise without relying on another high-frequency clean reference source in a self-referenced phase noise measurement scheme. FIG. 1(B) shows phase detection using a delay line discriminator. It should be noted that other methods for phase noise measurement without using reference source can be used for phase noise cancellation according to the present disclosure.

With continued reference to FIG. 1B, assuming the oscillator output can be represented as $v_o(t)=\sin(\omega_o t+\phi(t))$, the output of the delay line discriminator is given by, $$d(t) = \frac{1}{2}\cos(2\omega_0 t + \omega_0 t + \phi(t-\tau)) + \frac{1}{2}\cos(\omega_0 t + \phi(t) - \phi(t-\tau))$$
$$\cong \frac{1}{2}\sin(\tau\dot{\phi}(t))$$
$$\cong \frac{1}{2}\tau\dot{\phi}(t); \text{ where } \tau\dot{\phi}(t) << 1,$$

where $\tau$ is the amount of delay in the delay line discriminator. In deriving the second line of the above expression, it is assumed that the first term of d(t) will be low-pass filtered, and in the second term a $\omega_o\tau=\sin(2n+1)\pi/2$, where n is any integer, and Taylor's expansion is used. Therefore, the low-pass filtered output of the delay line discriminator is proportional to the derivative of phase noise for slowly varying phases. This output can be integrated to give $\phi(t)$.

It should be noted that as used herein, the term "block" includes reference to circuit and/or software (machine-readable code) structures that together operate (e.g., as means) to perform an identified function or action. For example, a phase-noise measurement block indicates a group of circuit and/or software structures that together measure phase noise. Furthermore, as used herein, the term "path" includes reference to the path electrical signals travel along or take within a circuit, structure and/or electrical component, e.g., as shown and indicated in the attached drawings.

FIG. 1C illustrates a simplified schematic of a feed-forward circuit 150 similar to that of FIG. 1A, with the inclusion of an integrator and phase modulator. As shown, oscillator 152 can have an output measured by a phase noise measurement block 154 and integrator 156 for use with phase modulator 158 in a feed-forward path. FM noise is indicated in the drawing as the most common noise in physical oscillators is white frequency modulation (FM) noise, or random walk phase modulation (PM) noise. In the time domain, timing jitter (TJ) is typically used; timing jitter can be derived from PN.

FIG. 1D illustrates a simplified schematic of a feedback circuit 180 for phase-noise cancellation/reduction, in accordance with exemplary embodiments of the present disclosure. As show, circuit 180 can include an oscillator 180 connected to a phase noise measurement block 184 and loop filter 186 configured in a feedback loop.

Figure 2:
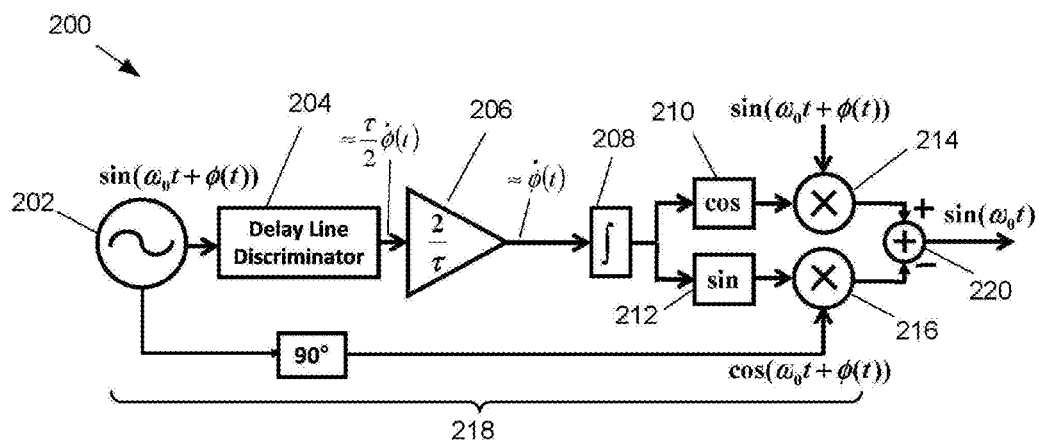
FIG. 2 illustrates a simplified schematic of a feed-forward phase-noise cancellation circuit with a delay-line discriminator, in accordance with exemplary embodiments of the present disclosure.

Once the phase noise of the noisy oscillator is measured, phase noise subtraction can be accomplished, e.g., by using single-sideband mixing. FIG. 2 illustrates phase noise subtraction utilizing the output of delay line discriminator for single-sideband mixing, in accordance with exemplary embodiments of the present disclosure.

FIG. 2 illustrates a simplified schematic of a feed-forward phase-noise cancellation circuit 200 with a delay-line discriminator, in accordance with exemplary embodiments of the present disclosure. Circuit 200 includes oscillator 202 and delay line discriminator 204 feeding op amp 206 and integrator 208. Integrator 208 produces $\phi(t)$ which is then fed to cosine and sine blocks (210 and 212) to produce $\sin(\phi(t))$ and $\cos(\phi(t))$. These quadrature signals are mixed with quadrature signals $\sin(\omega_0 t+\phi(t))$ and $\cos(\omega_0 t+\phi(t))$ using mixers 214 and 216. The resulting outputs can be summed/combined at junction/summer 220. Phase-shift line 218 is also shown which is used to produce $\cos(\omega_0 t+\phi(t))$).

The circuit scheme 200 shown in FIG. 2 assumes quadrature phases of the oscillator are available. Several standard methods can be used to generate quadrature phases, and on-chip calibration can be used to guarantee their accuracy, as is described in greater detail below. There may be practical difficulties for implementations of such quadrature phase noise cancellation. In general, it can be difficult to implement accurate sin( ) and cos( ) functions using analog circuits, and analog integrators are typically non-ideal (i.e., lossy).

Figure 3:
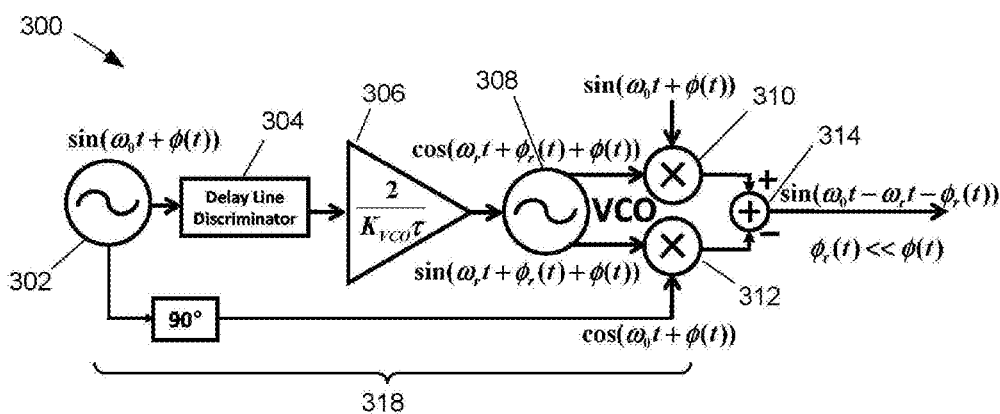
FIG. 3 illustrates a simplified schematic of a feed-forward phase-noise cancellation circuit with a delay-line discriminator including a voltage-controlled oscillator (VCO), in accordance with exemplary embodiments of the present disclosure.

As shown in FIG. 3, a Quadrature Voltage-Controlled Oscillator (QVCO) can serve as a phase integrator while producing the quadrature phases, simultaneously, for exemplary embodiments. FIG. 3 illustrates a phase noise subtraction circuit 300 utilizing the output of delay line discriminator using a low-frequency low phase-noise quadrature oscillator to realize phase integration and sin( )& cos( ) functions. Oscillator 302 provides a signal to delay line discriminator 304, which is connected to an amplifier 306. The output of the amplifier 306 can be supplied to Quadrature Voltage-Controlled Oscillator (QVCO) 308 producing the quadrature phases, which in turn are mixed shown by mixers 310 and 312. The outputs of mixers 310 and 312 can be combined by junction 314. A 90-degree phase shift/delay line 318 is also shown.

The final output frequency at 314 will be the difference between main oscillator and low-frequency QVCO frequencies. Though a fixed frequency shift caused by QVCO 308 is not critical, the phase noise addition due to the phase noise of QVCO 308 could be of concern for some applications. Accordingly, the QVCO 308 can be designed to operate at a much lower frequency compared with the main oscillator. Low frequency oscillators have a better phase noise; since, in general, phase noise improves by 20 dB with every decade of reduction in oscillating frequency. Moreover, for some applications, it is also possible to use low frequency crystal VCOs with an extremely low phase noise performance.

Embodiments of the present disclosure can enable achieving extremely low phase noise, comparable to that of crystal oscillators at the same offset frequency, for extremely high frequency oscillators.

For embodiments where a low-frequency crystal VCO is used, e.g., as depicted in FIG. 3, for phase subtraction, the output phase noise will be significantly better compared with that achieved in conventional frequency multiplier and PLL-based schemes that use the same crystal. In those systems, the crystal phase noise degrades by 6 dB per doubling of frequency. In embodiments of the present disclosure, the RF phase noise will ideally be identical to, or close to, the crystal phase noise at the same offset frequency. In other words, the output of embodiments of the present disclosure can be divided to beat the phase noise of the crystal (by 20 log ratio of RF to crystal frequencies).

Figure 4:
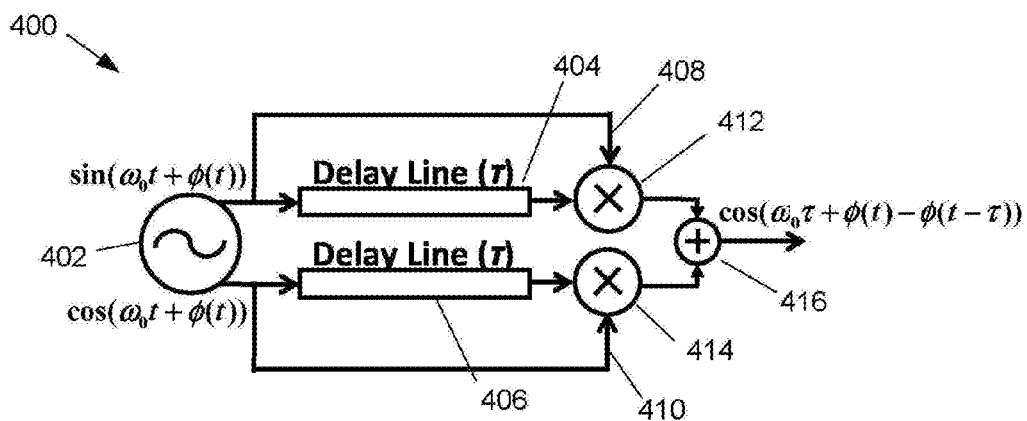
FIG. 4 illustrates a simplified schematic of a feed-forward phase-noise cancellation circuit with a quadrature delay-line discriminator, in accordance with exemplary embodiments of the present disclosure.

The extent of phase noise cancellation provided by embodiments of the present disclosure can depend on the accuracy of phase noise measurement and subtraction. One of the error mechanisms for imperfect phase cancellation is the low pass filter that is used after the delay line discriminator to filter out the high frequency component of d(t). The low pass filter introduces a small phase shift even at very low frequencies. Hence, the recovered phase of the noisy oscillator is not exactly the same as the input phase. A simple technique to eliminate the low pass filter is to use single-sideband mixing in the delay line discriminator (e.g., as shown in FIG. 4). Furthermore, the extent of phase noise cancellation depends on the sensitivity of phase noise measurement. The sensitivity of the phase noise measurement is affected by the gain of the phase detector and the noise added by the various blocks used in phase noise measurement. In case of phase detection using delay line discriminator, the gain is directly proportional to the delay of the delay line.

FIG. 4 depicts a schematic of a delay line discriminator circuit 400 utilizing SSB mixing to avoid LPF-induced phase error, e.g., which could possibly occur for embodiments according to FIG. 3. As shown, circuit 400 can include or be used with oscillator 402, dual delay lines 404, 406 and quadrature lines 408, 410 feeding mixers 410, 412. The mixers 410 and 412 in turn have their outputs summed/combined at junction 416.

Figure 5:
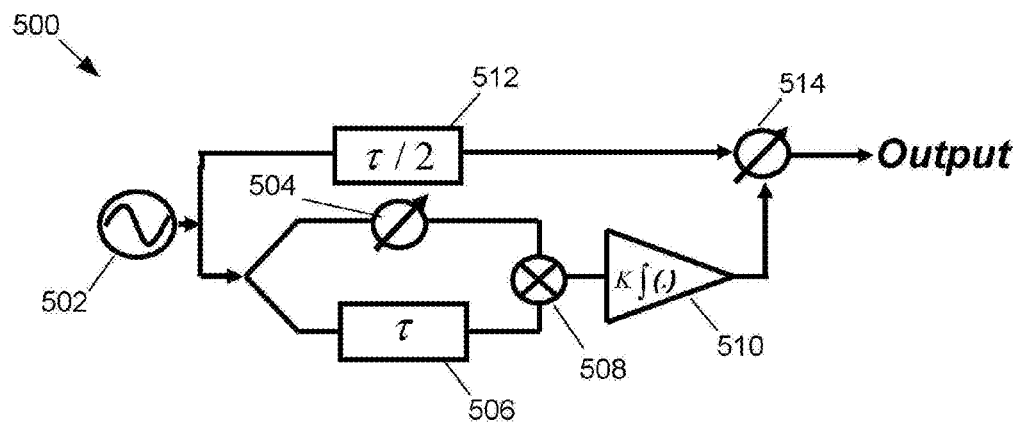
FIG. 5 illustrates a simplified schematic of a feed-forward phase-noise cancellation circuit including delay-compensation, in accordance with exemplary embodiments of the present disclosure.

FIG. 5 depicts a schematic of a feed-forward circuit 500 employing optional delay compensation, in accordance with exemplary embodiments of the present disclosure. As shown, circuit 500 includes an oscillator with a feed-forward path/loop including a delay line discriminator with phase modulator 504, delay line 506, and mixer 508. The output of mixer 508 is integrated by integrator 510. Optionally, the output of the integrator can be provided to mixer 514, which also receives an input from a delay line compensation block 512.

Without such delay compensation, the cancellation is 0 dB at the offset frequency $$\Delta f = \frac{1}{\tau}$$

and increases with a 20 dB/decade towards lower offsets. With such delay compensation, the cancellation is 0 dB at the offset frequency $$\Delta f = \frac{1}{\tau}$$

and increases, however, with a 40 dB/decade towards lower offsets.

Figure 6:
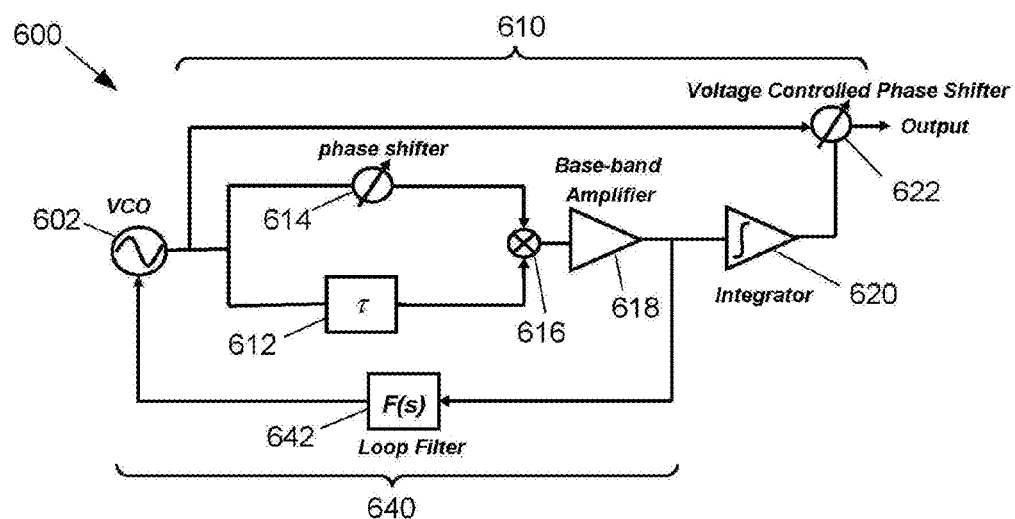
FIG. 6 illustrates a simplified schematic of a circuit with feed-forward and feedback phase noise cancellation, in accordance with exemplary embodiments of the present disclosure.

FIG. 6 depicts a simplified schematic of a dual-scheme phase noise reduction/cancellation circuit 600, in accordance with exemplary embodiments of the present disclosure. Circuit 600 can be used to reduce or cancel phase noise of oscillator 602, which may be a voltage-controlled oscillator. A feed-forward path/loop 610 includes a phase-noise measurement block with a delay line 612, phase shifter 614, and mixer 616 feeding base-band amplifier 618. The output of amplifier 618 is provided to integrator 620, which is configured to integrate phase and provide an output to voltage controlled phase shifter 622, as shown. Phase shifter 622 is also connected to oscillator 602.

Circuit 600 also includes a feedback loop 640 including a loop filter 642 connected to the output of the base-band amplifier 618 and providing feedback to the oscillator 602.

The dual-scheme functionality of circuit 600 can provide for increased bandwidth of phase noise cancellation. The feedback loop 640 can cancel or reduce close-in phase noise, while the feed-forward path/loop 610 can cancel or reduce high frequency phase noise content.

Figure 7:
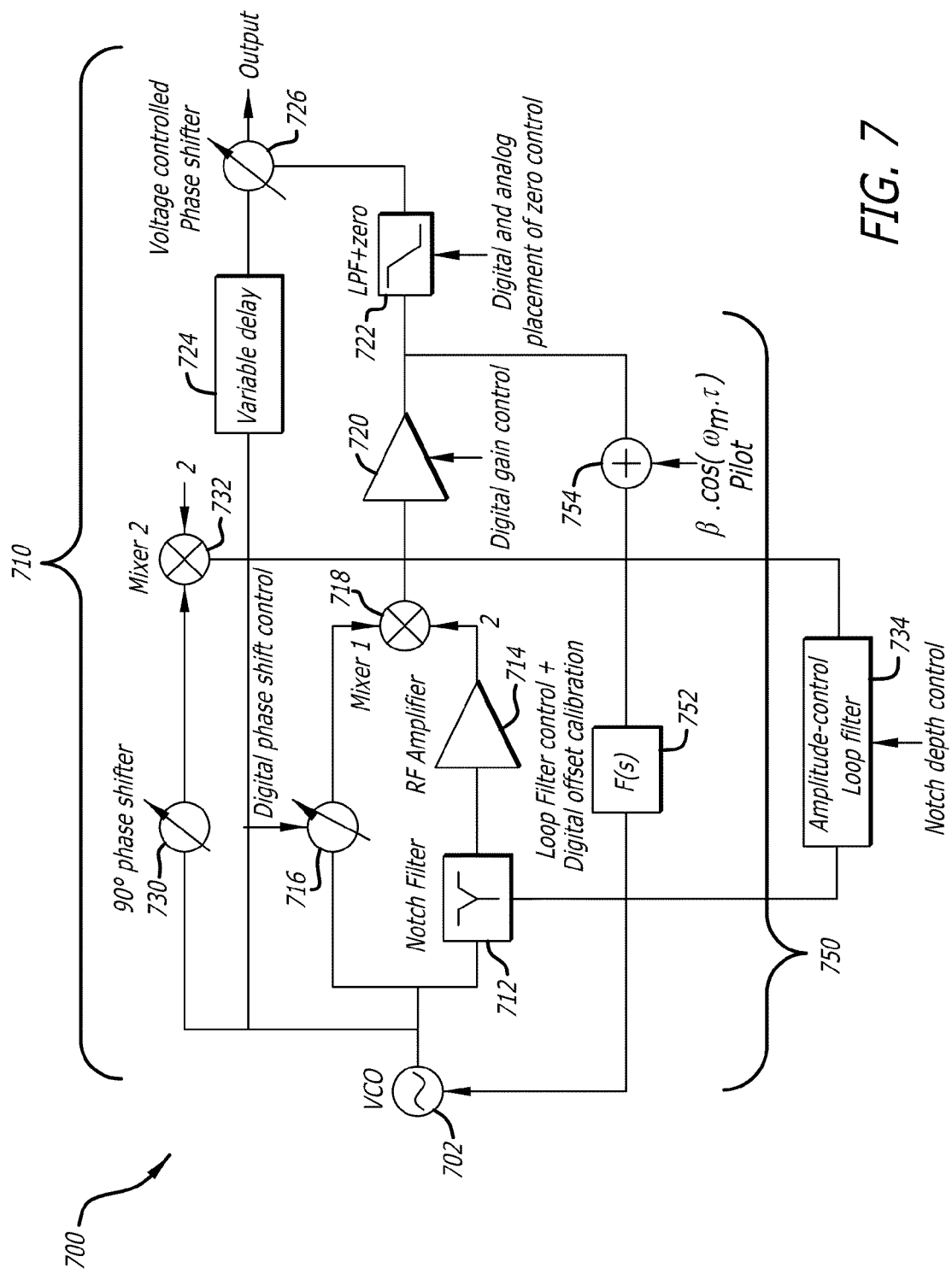
FIG. 7 illustrates a simplified schematic of a circuit with feed-forward and feedback phase noise cancellation, in accordance with exemplary embodiments of the present disclosure.

FIG. 7 depicts an exemplary embodiment of a dual-scheme phase noise reduction/cancellation circuit 700, in accordance with the present disclosure. Circuit 700 can be used to reduce or cancel phase noise of oscillator 702, which may be a voltage-controlled oscillator. A feed-forward path/loop 710 includes a phase-noise measurement block with a frequency discriminator including a notch filter 712, RF amplifier 714, phase shifter 716, and mixer 718 feeding base-band amplifier 720. Amplifier 720 can have digital gain control as indicated. The output of amplifier 720 can be provided to low-pass filter with zero 722, which is configured to provide an output to voltage controlled phase shifter 726, as shown. Phase shifter 726 is also connected to oscillator 702 by way of variable delay line 724

Circuit 700 also includes a feedback loop 750 including a loop filter 752 connected to the output of the base-band amplifier 720 and providing feedback to the oscillator 702. The feedback path/loop 750 can also include a summer 754 or junction for providing a pilot signal to the feedback path 750. Such a pilot signal can be useful to calibrate the position of poles and zeros in the gain of the feed-forward path 710. In some applications, the loop filter 752 can be configured as a second order filter with two integrators and a zero for providing quadrature signals at input ports of mixer 718.

Circuit 700 can also include an amplitude-control loop with amplitude-control loop filter 734 connected to notch filter 712 and a second mixer 732. Mixer 732 can be connected to the oscillator 702 by way of a 90-degree phase shifter 730 as shown.

Figure 8:
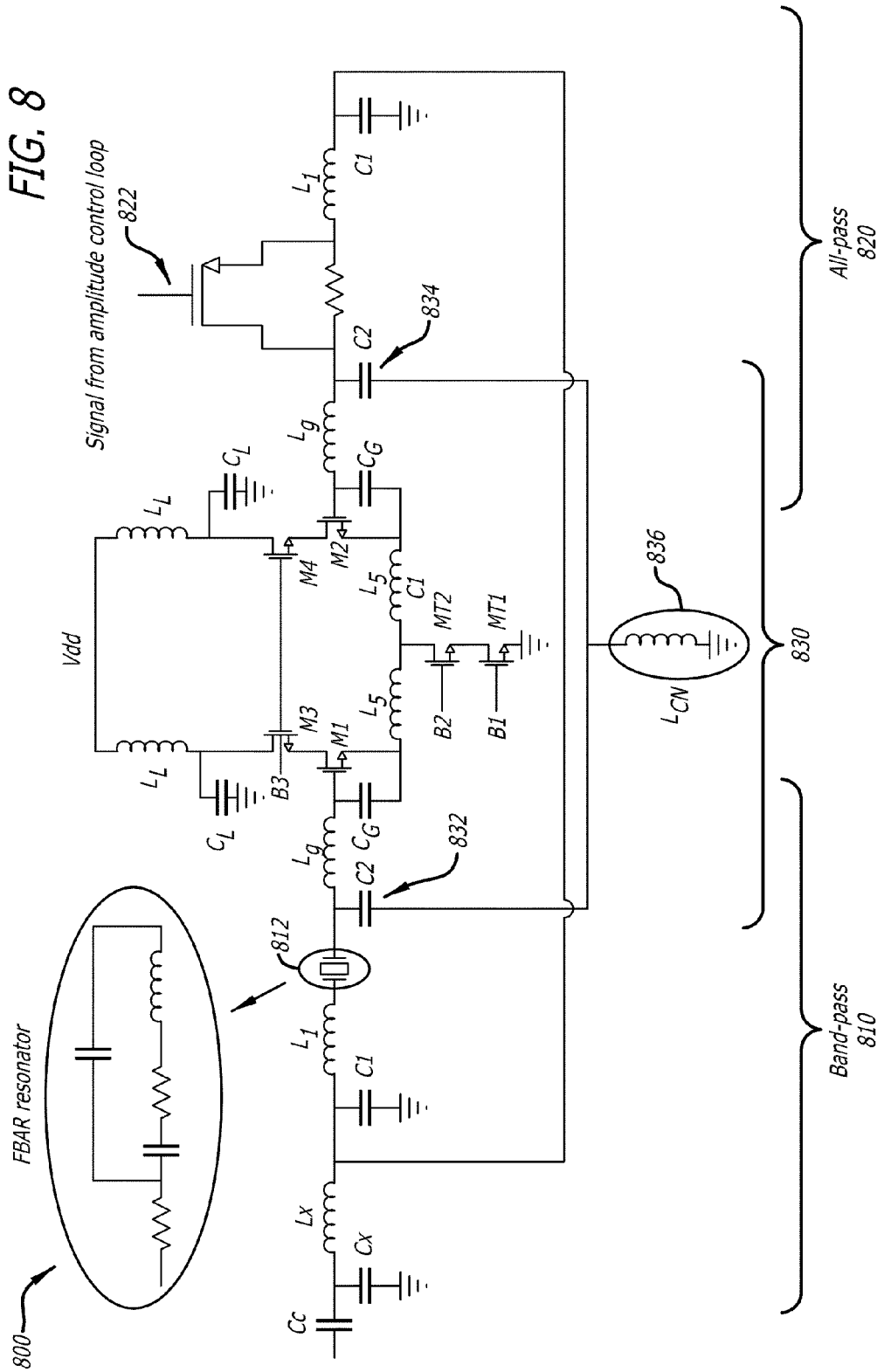
FIG. 8 illustrates schematics of a notch filter and RF amplifier, in accordance with exemplary embodiments of the present disclosure.

FIG. 8 depicts a notch filter and RF amplifier stage 800, in accordance with exemplary embodiments of the present disclosure. Circuit 800 includes a band-pass sub-circuit 810 with resonator 812. Circuit 800 also includes an all-pass sub-circuit 820 configured to receive a signal 822 from an amplitude control loop. An RF amplifier 830 is included that is configured for common-mode and differential operation. The RF amplifier 830 is connected to the band-pass sub-circuit 810 and the all-pass sub-circuit 820. The stage 800 is connected to ground by a common-mode trap including first and second capacitors 832, 834 in parallel that are connected in series to an inductor 836. In operation, inductor 836 resonates with the first and second capacitors 832, 834 during common-mode operation of the RF amplifier 830 and acts a virtual ground during differential mode operation of the RF amplifier 830. The resonator may be a film bulk acoustic resonator (FBAR) may be used in series mode to obtain a desire/required group delay in the band-pass portion, for exemplary embodiments. Other suitable resonators may also be used. The noted common-mode tap can improve common-mode rejection at the input of RF amplifier 830.

Stage 800 can advantageously leverage common mode and differential operation to reject unwanted tone and to generate a desired notch. The circuit architecture 800 shown may be particularly useful in a frequency discriminator according to exemplary embodiments of the present disclosure, e.g., notch filter 712 and FR amplifier 714 in the frequency discriminator in the feed-forward path of FIG. 7.

Figure 9:
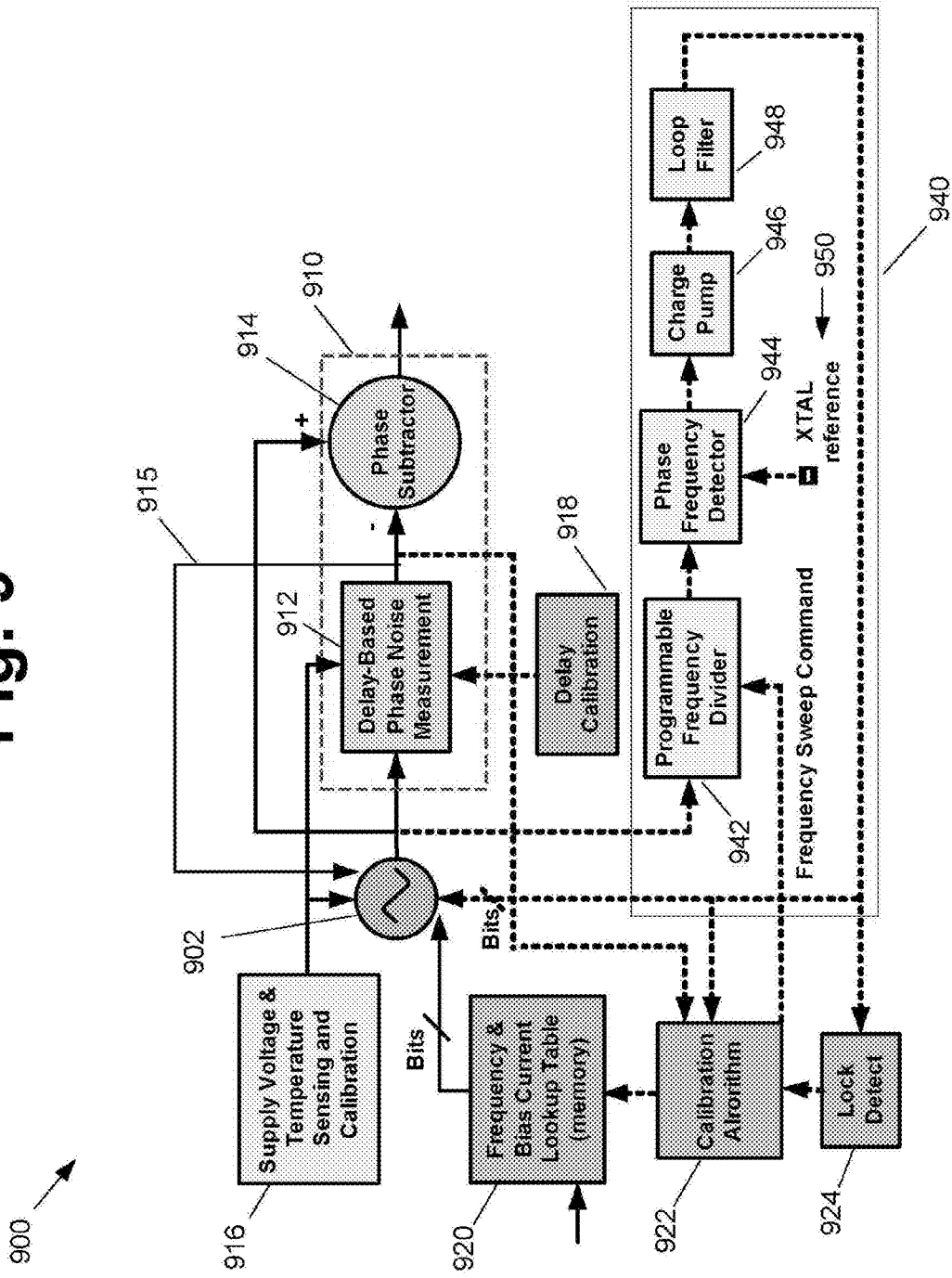
FIG. 9 illustrates a self-referenced oscillator with phase-noise cancellation, in accordance with exemplary embodiments.

FIG. 9 depicts a block diagram of a self-referenced oscillator phase-noise cancellation functional as a frequency synthesizer 900, in accordance with an exemplary embodiment of the present disclosure. Synthesizer 900 includes architecture or components that are designed for constant operation (indicated by solid connecting lines), including an oscillator 902 and a feed-forward loop 910 including a delay-based phase noise measurement block 912 and a phase subtractor 910 configured to output a signal with reduced phase noise or timing jitter. An optional feedback loop 915, e.g., including a loop filter, may also be present. The architecture of synthesizer 900 can also include voltage supply and calibration circuitry 915 to accommodate for PVT variations.

With continued reference to FIG. 9, synthesizer 900 can also include architecture or components designed for operation only upon start-up (indicated by dashed connecting lines), including a frequency calibration block 940 and related components including a delay calibration block 918, a frequency and bias current lookup table (implemented in/as suitable memory) 920, a calibration algorithm, and/or a lock detect block 924. Frequency calibration block 940 can include a programmable frequency divider 942, a phase frequency detector 944, a charge pump 946, loop filter 948, and/or crystal (or MEMS) reference 950 as shown.

As shown in FIG. 9, exemplary embodiments of the present disclosure include a self-referenced integrated oscillator functioning as an agile synthesizer that can achieve a low close-in phase noise that is better than that of an oscillator that is locked to an off-chip crystal in a Phase Locked Loop (PLL). The self-referenced oscillator includes on-chip calibration circuitry to guarantee a fixed frequency in the presence of Process, Voltage, and Temperature (PVT) variations. Another advantage of such a self-referenced phase-noise-cancelled oscillator compared with PLL-based solutions is its much faster (×10-100) frequency hopping speed. Compared with Direct Digital Synthesis (DDS), consumes much less power (×10-160). Finally, the presently-disclosed phase noise cancellation scheme can also be extended to domains other than RF systems.

The architecture of the low-power low-phase-noise agile frequency synthesizer 900 can operate at extremely high frequencies, e.g., in the GHz regime. The oscillator 900 is a self-referenced wideband digitally controlled oscillator. During the system start-up, the oscillator and the building blocks in the phase noise cancellation are process calibrated at the desired frequencies. The calibration bits are stored in a look-up table for future use. In normal operation, the look-up table provides digital calibration bits for oscillator and the phase noise cancellation for a low phase noise oscillation at the desired frequency. The voltage and temperature drifts are constantly calibrated to keep the oscillation frequency fixed.

Accordingly, aspects and embodiments of the present disclosure can provide benefits and advantages over previous techniques.

Compared with phase-locked loops, where the speed of the system is determined by the loop filter, the speed of such feed-forward cancellation schemes according to the present disclosure can be orders of magnitude faster. Hence, a low-phase-noise fast-frequency-hopping system is achievable using the presently-disclosed feed-forward phase noise cancellation system. Direct digital synthesizers (DDS) can also produce very fast-hopping and low-phase-noise tones. However, the maximum frequency of DDS is limited to half the reference frequency. In general, for high accuracy DDS, the reference frequency is in MHz or low-GHz range. Recently, several papers have shown high speed DDS working at above 10 GHz. The power consumption of those schemes, however, is extremely high (Watts), and will be even larger as the speed is increased. In contrast, frequency synthesis using the presently-disclosed phase noise cancellation techniques requires as low as a few tens of milli-Watts of power. In summary, frequency synthesis using the presently-disclosed phase noise cancellation scheme can achieve frequency hopping speed similar to that of a DDS, while consuming power of typical PLLs.

Embodiments of the present disclosure providing for phase noise cancellation/reduction can also be applied for spurious tone rejection. Using the presently-disclosed solution, it is possible to attenuate spurious tones around main carrier tone. For example, FM/PM modulation of a carrier can be drastically reduced using this scheme.

In comparison with PLL-based solutions, embodiments of the present disclosure do not require an off-chip crystal (cost and footprint saving).

Embodiments and aspects according to the present disclosure can applied to various applications. For example, embodiments can be utilized advantageously for RF and wireless transceivers. In synchronous wireless transceivers, a Local Oscillator (LO) is used to generate/detect the desired RF signal. The frequency of this LO must be exactly equal to that used in the other end of communication link (synchronous communication). The LO phase-noise directly affects the quality of the signal detection/demodulation (increases bit-error-rate) and the signal transmission/modulation (spreads the signal to adjacent channels that is dedicated to other users of the spectrum).

For example, embodiments can be utilized advantageously for radar system. All radars rely on an accurate timing circuitry to detect the position and speed of the objects of interest. For instance, in Doppler radar a LO is required to detect the Doppler shift caused due to moving target. However, there is a presence of high power unwanted clutter signals at frequencies around the target. Due to the low phase noise of the LO, these unwanted clutter signals deteriorates the quality of detection of the Doppler shift.

For example, embodiments can be utilized advantageously for Wire-line transceivers. Wire-line transceivers (through optical fiber or copper) also rely on synchronous detection of signals and as such require a stable low-jitter clock. Higher jitter clocks increase the bit-error-rate and in extreme cases can cause losing the synchronous operation. For further example, embodiments can be utilized advantageously for Microprocessors. Most, if not all, processors are synchronous. All the commands are typically run at the same time. Synchronization is achieved though precise clocks. For yet another example, embodiments can be utilized advantageously for Networking. Similar to all the above-described technology areas, existing networking schemes are synchronous and require precise timing.

Figure 10:
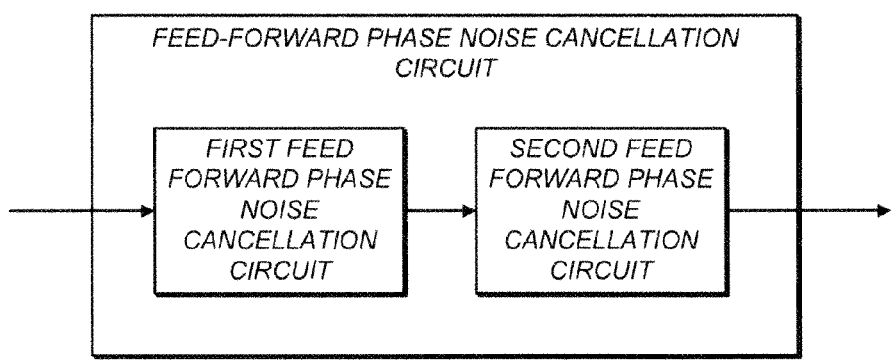
FIG. 10 illustrates a cascaded multi-stage of two feed-forward phase-noise cancellation circuits that may be used in a feed forward phase noise cancellation circuit.

A cascaded multi-stage of two or more feed-forward phase-noise cancellation circuits may be used in a feed forward phase noise cancellation circuit. FIG. 10 illustrates a cascaded multi-stage of two feed-forward phase-noise cancellation circuits that may be used in a feed forward phase noise cancellation circuit.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

For example, when practical or feasible, a high-Q GHz resonator (e.g., a MEMs device) can be utilized in or for embodiments of the present disclosure as a frequency discriminator in the phase-noise cancellation circuitry and achieve an order-of-magnitude lower phase noise compared with conventional oscillators that use the same MEMS resonator. Further, high-Q MEMs resonators operational in the GHz regime can be integrated on top of standard silicon processes and utilized in embodiments of the present disclosure. An example of such a suitable MEMS resonator is available from Silicon Clocks: http://www.siliconclocks.com. Embodiments of the present disclosure can be applied to oscillators operating at Radio Frequencies (RF), microwaves, millimeter-wave, sub-millimeter-waves, Tera-Hertz (THz), and beyond. Embodiments of the present disclosure, e.g., those including an open-loop oscillator with feed-forward phase-noise cancellation scheme, can provide for fast frequency modulation and frequency hopping at orders-of-magnitude lower power consumption compared with previous DDS techniques.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases in a claim mean that the claim is not intended to and should not be interpreted to be limited to any of the corresponding structures, materials, or acts or to their equivalents.

Nothing that has been stated or illustrated is intended or should be interpreted to cause a dedication of any component, step, feature, benefit, advantage, or equivalent to the public, regardless of whether it is recited in the claims.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

The invention claimed is:

1. A feed-forward phase-noise-cancellation circuit comprising:
    a phase-noise measurement block adapted to measure a phase noise of an oscillator; and
        a variable phase-shifter configured to modulate the phase of the oscillator with the measured phase-noise, and subtract the phase noise from the oscillator; or
        a mixer or frequency multiplier to subtract the measured phase noise from the oscillator output phase,
    wherein the phase-noise measurement block is configured as a delay line frequency discriminator followed by an integrator; and
        the integrator following the delay line frequency discriminator comprises a voltage-Controlled oscillator; or
        the delay line frequency discriminator comprises a quadrature frequency discriminator that has a configuration that receives two inputs 90 degrees out of phase; or
        the feed-forward scheme has a main, non-frequency discriminated path and a delay compensation line is used in the main, non-frequency discriminated path of the feed-forward scheme; or
        the circuit further comprises a cascaded multi-stage of two or more feed-forward phase-noise cancellation circuits.

2. The circuit of claim 1, further comprising the oscillator.

3. The circuit of claim 1, wherein the integrator following the delay line frequency discriminator comprises a voltage-controlled oscillator.

4. The circuit of claim 3, wherein the voltage-controlled oscillator comprises a quadrature voltage-controlled oscillator followed by quadrature mixers for single-sideband phase subtraction.

5. The circuit of claim 1, wherein the delay line frequency discriminator comprises a quadrature frequency discriminator that has a configuration that receives two inputs 90 degrees out of phase.

6. The circuit of claim 1, wherein the feed-forward scheme has a main, non-frequency discriminated path and a delay compensation line is used in the main, non-frequency discriminated path of the feed-forward scheme.

7. The circuit of claim 1, further comprising a cascaded multi-stage of two or more feed-forward phase-noise cancellation circuits.

8. The circuit of claim 1, further comprising a feedback loop circuit.

9. The circuit of claim 1, further comprising a feedback circuit configured to receive an output of the oscillator and provide feedback to the oscillator.

10. The circuit of claim 9, wherein the feed-forward circuit comprises an amplifier that follows the discriminated frequency and/or phase to boost the level of the discriminated frequency and/or the phase to a desired level.

11. A dual-scheme phase-noise cancellation circuit comprising:
    a feed-forward path configured to cancel high-frequency content of an oscillator output phase; and
    a feedback path to cancel close-in phase noise wherein:
        the feed-forward path comprises a frequency discriminator and the frequency discriminator comprises a notch filter; or
        the feed-forward path comprises a frequency discriminator, the frequency discriminator comprises an RF amplifier and a first mixer, a loop filter is included in the feed-back path, and the loop filter is a second order filter with two integrators and a zero for providing quadrature signals at input ports of the first mixer; or
        the feed-back path further includes a summer providing a pilot signal to the feedback path, wherein the pilot signal is configured to calibrate the position of poles and zeros in the gain of the feed-forward path.

12. The circuit of claim 11, further comprising the oscillator.

13. The circuit of claim 11, wherein the feed-forward path comprises a frequency discriminator.

14. The circuit of claim 13, wherein the frequency discriminator comprises a notch filter.

15. The circuit of claim 13, wherein the frequency discriminator comprises an RF amplifier and a first mixer.

16. The circuit of claim 15, wherein a loop filter is included in the feed-back path.

17. The circuit of claim 16, wherein the loop filter is a second order filter with two integrators and a zero for providing quadrature signals at input ports of the first mixer.

18. The circuit of claim 11, wherein the feed-forward path includes a low-pass filter and a zero stage.

19. The circuit of claim 11, wherein the feed-back path further includes a summer providing a pilot signal to the feedback path, wherein the pilot signal is configured to calibrate the position of poles and zeros in the gain of the feed-forward path.

20. A frequency synthesizer including a self-referenced oscillator with phase-noise cancellation, the synthesizer comprising:
    a tunable oscillator configured to produce an output signal at a desired frequency;
    a feed-forward path including a delay-based phase noise measurement block and a phase subtractor;

a supply voltage and temperature sensing and calibration block;
a delay calibration block; and a
frequency-calibration block, wherein:
the synthesizer further comprises a feedback path including a loop filter connected to an output of the feed-forward path and an input of the oscillator, and the loop filter is a second order filter with two integrators and a zero for providing quadrature signals; or
the feed-forward path comprise a frequency discriminator and the frequency discriminator comprises a notch filter.

21. The synthesizer of claim 20, further comprising a feedback path including a loop filter connected to an output of the feed-forward path and an input of the oscillator.

22. The synthesizer of claim 20, wherein the synthesizer is configured in an integrated circuit.

23. The synthesizer of claim 21, wherein the loop filter is a second order filter with two integrators and a zero for providing quadrature signals.

24. The synthesizer of claim 20, wherein the feed-forward path comprise a frequency discriminator.

25. The synthesizer of claim 24, wherein the frequency discriminator comprises a notch filter.

26. The synthesizer of claim 25, wherein the frequency discriminator further comprises a RF amplifier including a common-mode trap.

* * * * *